United States Patent
Mihara et al.

(10) Patent No.: US 7,295,421 B2
(45) Date of Patent: Nov. 13, 2007

(54) MULTILAYER CERAMIC ELECTRONIC COMPONENTS AND METHOD FOR MANUFACTURING THE SAME

(75) Inventors: Kenjiro Mihara, Yokaichi (JP); Atsushi Kishimoto, Omihachiman (JP); Hideaki Niimi, Hikone (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 151 days.

(21) Appl. No.: 10/541,916

(22) PCT Filed: Feb. 18, 2004

(86) PCT No.: PCT/JP2004/001846

§ 371 (c)(1),
(2), (4) Date: Jul. 12, 2005

(87) PCT Pub. No.: WO2004/075216

PCT Pub. Date: Sep. 2, 2004

(65) Prior Publication Data

US 2006/0145401 A1    Jul. 6, 2006

(30) Foreign Application Priority Data

Feb. 21, 2003   (JP)   .............................. 2003-044753

(51) Int. Cl.
*H01G 4/06* (2006.01)
(52) U.S. Cl. .............................. 361/308.1; 361/306.1; 361/306.3; 361/309; 361/310
(58) Field of Classification Search ................ 174/255, 174/260; 361/303, 305, 308.1, 309–310, 361/301.4, 306.1, 306.3

See application file for complete search history.

(56) References Cited

U.S. PATENT DOCUMENTS

| | | | |
|---|---|---|---|
| 5,493,266 A | 2/1996 | Sasaki et al. | |
| 5,712,758 A * | 1/1998 | Amano et al. | 361/321.2 |
| 6,344,963 B1 * | 2/2002 | Mori | 361/306.3 |
| 6,356,430 B1 * | 3/2002 | Yoshida et al. | 361/305 |
| 6,898,069 B2 * | 5/2005 | Yamaguchi et al. | 361/303 |
| 6,984,543 B2 * | 1/2006 | Mihara et al. | 438/55 |
| 2003/0030192 A1 | 2/2003 | Niimi et al. | |

FOREIGN PATENT DOCUMENTS

| | | |
|---|---|---|
| GB | 2 258 084 A | 1/1993 |
| JP | 57-148334 | 9/1982 |
| JP | 63-224210 | 9/1988 |
| JP | 04-337617 | 11/1992 |
| JP | 05-029680 | 2/1993 |
| JP | 06-181101 | 6/1994 |
| JP | 06-302404 | 10/1994 |

(Continued)

*Primary Examiner*—Cathy F. Lam
(74) *Attorney, Agent, or Firm*—Keating & Bennett, LLP

(57) ABSTRACT

A multilayer ceramic electronic component includes a skittered laminated body including internal electrodes that have a strength that is greater than that of ceramic layers provided therein. End portions of the internal electrodes protrude from end surfaces of the laminated body and are deformed so as to extend along the end surfaces by a barrel polishing process using balls. When external electrodes are formed on the end surfaces of the laminated body, a large contact area with the internal electrodes can be obtained. Therefore, a reliability of the electrical connection between the electrodes is definitely secured.

6 Claims, 3 Drawing Sheets

FOREIGN PATENT DOCUMENTS

| | | |
|---|---|---|
| JP | 07-235442 | 9/1995 |
| JP | 09-266131 | 10/1997 |
| JP | 11-288840 | 10/1999 |
| JP | 11-288841 | 10/1999 |
| JP | 2000-082605 | 3/2000 |
| JP | 2001-130957 | 5/2001 |

* cited by examiner

MULTILAYER CERAMIC ELECTRONIC COMPONENTS AND METHOD FOR MANUFACTURING THE SAME

BACKGROUND OF THE INVENTION

1. Field of the Invention

The present invention relates to multi layer ceramic electronic components and methods for manufacturing the electronic components. Furthermore, the present invention relates to an improvement in the reliability of electrical connections between internal electrodes and external electrodes, which are provided in the multi layer ceramic electronic components.

2. Description of the Related Art

Typical examples of multi layer ceramic electronic components in connection with the present invention are laminate-type theorists having a positive temperature coefficient. The laminate-type theorist having a positive temperature coefficient usually has the structure described below.

The laminate-type theorist having a positive temperature coefficient includes a laminated body as a main component. The laminated body has a plurality of ceramic layers and a plurality of internal electrodes that extend along predetermined interfaces between the ceramic layers. The ceramic layers are composed of a theorist material having a positive temperature coefficient of resistance. The internal electrodes include first internal electrodes that extend to a first end surface of the laminated body and second internal electrodes that extend to a second end surface, opposite the first end surface, of the laminated body. The first electrodes and the second electrodes are alternately arranged in the lamination direction.

The laminate-type theorist having a positive temperature coefficient is provided with a first external electrode and a second external electrode which are disposed on the first and second end surfaces, respectively, of the laminated body. The first external electrode is in electrical contact with the first internal electrodes at the first end surface of the laminated body. The second external electrode is in electrical contact with the second internal electrodes at the second end surface of the laminated body.

Such a laminate-type theorist having a positive temperature coefficient is usually manufactured according to the method described below.

A step for preparing a green laminated body is conducted. The green laminated body is converted into the above-mentioned skittered laminated body by firing. The green laminated body includes ceramic green sheets for ceramic layers and conductive paste films for the internal electrodes.

In particular, the ceramic green sheets are prepared by mixing a powdery ceramic material such as a $Batik_3$-based material, an organic binder, and an organic solvent in order to make a slurry and by forming the slurry into sheets by a doctor blade method or the like.

Conductive paste is prepared by mixing a base metal powder such as In powder, an organic binder, and an organic solvent. The conductive paste is applied on the ceramic green sheets by a screen-printing method or the like to provide conductive paste films for the internal electrodes.

The green laminated body is prepared by laminating the plurality of ceramic green sheets provided with the conductive paste films for the internal electrodes, and by pressing the laminated ceramic green sheets in the lamination direction.

The resulting green laminated body may be cut, if necessary, and then is skittered to provide a skittered laminated body. When a base metal such as Ni is used as the conductive element for the internal electrodes, the sintering process is conducted under a reducing atmosphere in order to prevent oxidation of the base metal. In such a case, after the sintering process, the skittered laminated body is heated (revalidation) under an oxidizing atmosphere to provide the ceramic layers with positive temperature characteristics.

The skittered laminated body is then polished by barrel polishing that is generally conducted for most of the chip-type ceramic electronic components in a manufacturing process. The barrel polishing process is conducted to prevent chipping of the laminated body or to prevent a change in characteristic caused by chipped ceramic debris of the laminated body adhering to another laminated body. The barrel polishing process rounds the corners and the edges of the skittered laminated body.

The external electrodes are formed by, for example, sputtering or firing the conductive paste on the first end surface and the second end surface of the laminated body. The external electrodes are composed of a metal having high affinity with a metal that is contained in the internal electrodes.

However, the laminate-type theorist having a positive temperature coefficient manufactured by the method described above may have following problems.

In general, the conductive paste films have high contractibility compared with the ceramic green sheets. Therefore, when the green laminated body having the ceramic green sheets and the conductive paste films is monolithic ally fired in the sintering process, the internal electrodes may not reach the end surfaces of the skittered laminated body. In such a case, the internal electrodes are not completely connected to the external electrodes electrically and mechanically. As a result, the multi layer ceramic electronic component such as the laminate-type theorist having a positive temperature coefficient cannot exhibit satisfactory characteristics.

A possible solution to this problem is disclosed in, for example, Japanese Unexamined Patent Application Publication No. 6-181101. In this method, a conductive paste for external electrodes is applied on end surfaces of a green laminated body having ceramic green sheets and a conductive paste for internal electrodes before firing the green laminated body. Specifically, the ceramic green sheets, the conductive paste for internal electrodes, and the conductive paste for external electrodes are fired at the same time.

According to this method, when the conductive paste for external electrodes is applied to the green laminated body, the shrinkage caused by firing the conductive paste for internal electrodes inside the green laminated body does not occur. Therefore, the conductive paste for external electrodes and the conductive paste for internal electrodes certainly come into contact with each other. As a result, electrical and mechanical connections between the external electrodes and the internal electrodes are ensured.

However, this method has the following problem. In the above-mentioned method, the barrel polishing process for preventing chipping of the skittered laminated body must be conducted after the firing process. Specifically, when the sintering process is completed, the skittered laminated body is already provided with the external electrodes. Accordingly, the external electrodes are partially polished by barrel polishing. As a result, the reliability of the electrical connection between the external electrodes and the internal electrodes may be decreased.

For example, Japanese Unexamined Patent Application Publication Nods. 11-288840 and 11-288841 disclose a method for removing a particular portion, i.e. The ceramic layer, of the end surfaces of the skittered laminated body mechanically by sandblasting the end surfaces of the skittered laminated body. As a result, the end portions of the internal electrodes are sufficiently exposed at the end surfaces of the laminated body.

However, when the above-mentioned method is applied to a laminated body that has high-hardness ceramic layers, for example, a laminated body for a multi layer ceramic capacitor, not only the ceramic layers are removed but also the internal electrodes are undesirably removed. Accordingly, the sandblasting process may be meaningless and a reliable electrical connection between the internal electrodes and external electrodes may not be provided.

When the sandblasting is conducted, the end surfaces of the laminated bodies must be aligned in the blowing direction of alumna powder or the like. Accordingly, the sandblasting of a large number of laminated bodies require many working hours for aligning the laminated bodies in the desired direction. Therefore, sandblasting is unsuitable for mass production.

SUMMARY OF THE INVENTION

In order to overcome the problems described above, preferred embodiments of the present invention provide a multi layer ceramic electronic component which has improved reliability in terms of electrical and mechanical connections of internal electrodes and external electrodes, and a method of manufacturing such a novel multi layer ceramic electronic component.

According to a preferred embodiment of the present invention, a multi layer ceramic electronic component includes a laminated body and external electrodes. The laminated body includes a plurality of ceramic layers and a plurality of internal electrodes extending along predetermined interfaces between the ceramic layers. The external electrodes are disposed on the end surfaces extending in the lamination direction of the laminated body and are in electrical contact with the predetermined internal electrodes. The present invention can solve the above-mentioned technological problems with the unique structure described below.

More specifically, each of the internal electrodes includes a main portion located between the ceramic layers, and an end portion extending from the main portion and being in electrical contact with the external electrode on the end surface of the laminated body. The end portion is characterized by an extension along the end surface of the laminated body.

Such a structure allows the contact area between the internal electrodes and the external electrode to increase. Therefore, the reliability of the electrical contact between the internal electrodes and the external electrodes is increased and the strength of the connection between the internal electrodes and the external electrodes is increased. As a result, the resistance characteristics of the multi layer ceramic electronic component can be stabilized.

When the internal electrodes for the multi layer ceramic electronic component according to preferred embodiments of the present invention have a specific structure as described above, there are two possible types of extension. A first extension extends in one direction along the end surface of the laminated body so that the end portion and the main portion of the internal electrode together define a substantially L-shaped cross-section. A second extension extends in different directions along the end surface of the composite so that the end portion and the main portion of the internal electrode together define a substantially T-shaped cross-section.

The second extension of the two shapes is particularly preferable because the second extension can provide a larger contact area between the internal electrodes and the external electrodes than the first extension can. Therefore, the reliability of the electrical and mechanical connections between the internal electrodes and the external electrodes can be increased.

In particular, the present invention is advantageously applied to a multi layer ceramic electronic component having the following structure. The multi layer ceramic electronic component has external electrodes and internal electrodes. The external electrodes include a first external electrode disposed on a first end surface of a laminated body and a second external electrode disposed on a second end surface, opposite the first end surface, of the laminated body. The internal electrodes include first internal electrodes in electrical contact with the first external electrode and second internal electrodes in electrical contact with the second external electrode. The first internal electrodes and the second internal electrodes are alternately disposed in the lamination direction of the laminated body. Examples of the multi layer ceramic electronic component having such a structure include a laminate-type theorist having a positive temperature coefficient, a laminate-type theorist having a negative temperature coefficient, a laminate-type ceramic capacitor, and a laminate-type ceramic varsity.

The present invention can be advantageously applied to a multi layer ceramic electronic component including the ceramic layers composed of a semi conductive ceramic having a positive temperature coefficient of resistance, for example, a laminate-type theorist having a positive temperature coefficient. When the specific structure according to a preferred embodiment of the present invention is applied to the laminate-type theorist having a positive temperature coefficient, the resistance of the electrical contact area between the internal electrodes and the external electrodes can be decreased and the connection between the internal electrodes and the external electrodes can be stabilized. Therefore, the resistance value is stabilized and the theorist characteristics such as Curie temperature can be stabilized. Stability in an overload test can also be secured.

In the multi layer ceramic electronic component according to a preferred embodiment of the present invention, preferably, the ceramic layers have a skittered density between about 60% and about 85% and the main portions of the internal electrodes have a thickness of about 0.5 μm or more. With such a structure, when the multi layer ceramic electronic component is manufactured by processes as described-below, the end portions can have the extensions extending along the end surfaces of the laminated body. The main portion of the internal electrode having a thickness of about 3.0 μm or less can further decrease the desalination between the ceramic layers and the internal electrodes.

Another preferred embodiment of the present invention provides a method for manufacturing the multi layer ceramic electronic component including a laminated body and external electrodes. The laminated body includes a plurality of ceramic layers and a plurality of internal electrodes extending along predetermined interfaces between the ceramic layers. The external electrodes are disposed on end surfaces extending in the lamination direction of the laminated body and are in electrical contact with the predetermined internal electrodes.

The method for manufacturing the multi layer ceramic electronic component according to a preferred embodiment of the present invention includes the steps of preparing a green laminated body, sintering the green laminated body into a skittered laminated body, and forming external electrodes on the end surfaces of the skittered laminated body. The green laminated body includes ceramic green sheets for the ceramic layers and conductive paste films for the internal electrodes.

For solving the above-mentioned technological problems during such a manufacturing process, preferred embodiments of the present invention have the following unique characteristics.

In the step of preparing the green laminated body, the thickness of the conductive paste films is determined so that the internal electrodes after the step of sintering preferably have a thickness between about 0.5 μm and about 3.0 μm. Furthermore, the step of sintering is controlled so that the ceramic layers of the skittered laminated body have a skittered density between about 60% and about 85%.

A barrel polishing process is conducted between the steps of sintering and the steps of forming the external electrodes. By barrel polishing the skittered laminated body with balls, the end portions of the internal electrodes protrude from the end surfaces of the skittered laminated body and then are deformed to extend along the end surfaces. The protruding and deforming end portions of the internal electrodes come into electrical contact with the external electrodes.

In the method for manufacturing the multi layer ceramic electronic component, extensions which extend along the end surfaces of the laminated body can be efficiently formed at the end portions of the internal electrodes by the barrel polishing process.

More specifically, the internal electrodes preferably have a thickness of about 0.5 μm or more so as to keep a predetermined strength. The ceramic layers preferably have a low skittered density such as about 85% or less. With this combination, the strength of the ceramic layers can be reduced so as to be lower than that of the internal electrodes in the skittered laminated body. Under the circumstances, the ceramic layers are chipped off earlier than the internal electrodes by the barrel polishing process using the balls for the skittered laminated body. Therefore, the end portions of the internal electrodes protrude from the end surfaces of the laminated body. The protruding end portions of the internal electrodes are struck toward the end surfaces of the laminated body by the balls. As a result, the end portions are caused to extend along the end surfaces of the laminated body and then are flattened by plastic deformation. Consequently, the end portions, which function as the area of contact with the external electrodes, of the internal electrodes define extensions extending on the end surfaces of the laminated body.

In the method for manufacturing the multi layer ceramic electrode component according to a preferred embodiment of the present invention, preferably, the balls have a diameter smaller than the dimension of the end surfaces of the laminated body in the lamination direction. If the diameter of the balls is larger than the dimension of the end surfaces of the laminated body in the lamination direction, the end portions, protruding from the end surfaces of the laminated body, of the internal electrodes are easily chipped off.

Other features, elements, steps, characteristics and advantages of the present invention will become more apparent from the following detailed description of preferred embodiments thereof with reference to the attached drawings.

BRIEF DESCRIPTION OF THE DRAWINGS

FIG. 3 is a view, corresponding to FIG. 2, illustrating internal electrodes protruding from the end surface of the laminated body in a barrel polishing process that the skittered laminated body shown in FIG. 2 is subjected to.

DETAILED DESCRIPTION OF PREFERRED EMBODIMENTS

Figure 1:
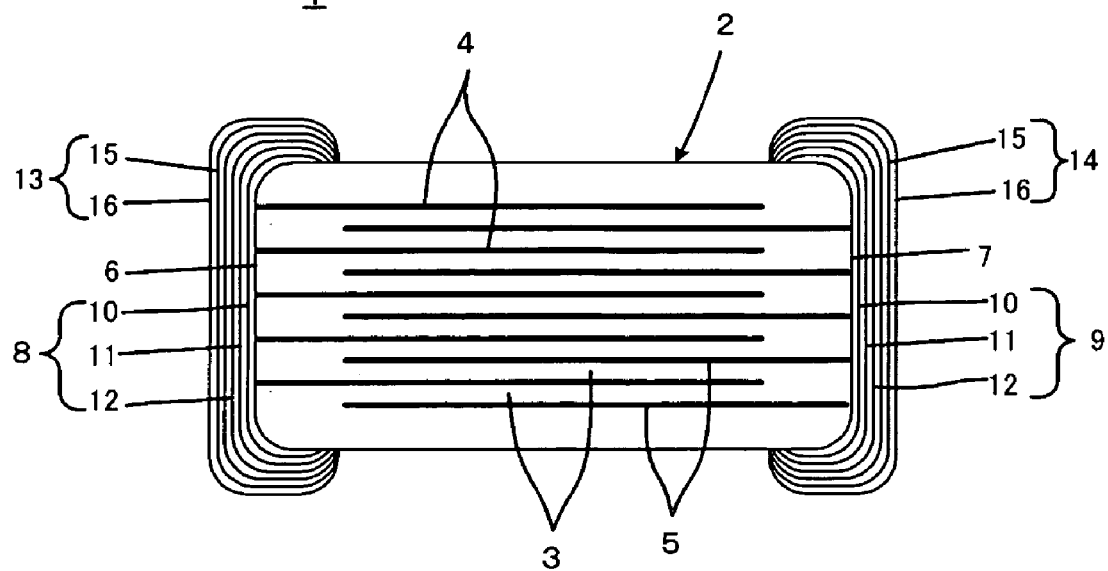
FIG. 1 is a cross-sectional view illustrating a multi layer ceramic electronic component according to a preferred embodiment of the present invention.

A structure of a multi layer ceramic electronic component 1 shown in FIG. 1 is applicable to, for example, a laminate-type theorist having a positive temperature coefficient, a laminate-type theorist having a negative temperature coefficient, a laminate-type ceramic capacitor, and a laminate-type ceramic varsity.

With reference to FIG. 1, the multi layer ceramic electronic component 1 includes a laminated body 2 as a main part of the component. The laminated body 2 includes a plurality of ceramic layers 3 and a plurality of internal electrodes 4 and 5 extending along predetermined interfaces between the ceramic layers 3. The internal electrodes 4 and 5 include first internal electrodes 4 which extend to a first end surface 6 of the laminated body 2 and second internal electrodes 5 which extend to a second end surface 7, opposite the first end surface 6 of the laminated body 2. The first and second end surfaces 6 and 7 extend in the lamination direction of the laminated body 2. The first electrodes 4 and the second electrodes 5 are alternately arranged in the lamination direction of the laminated body 2.

A ceramic material for the ceramic layers 3 is determined depending on the function of the multi layer ceramic electronic component 1. In particular, the ceramic layers 3 may be composed of, for example, semi conductive ceramics, dielectric ceramics, piezoelectric ceramics, or magnetic ceramics. When the multi layer ceramic electronic component 1 is a laminate-type theorist having a positive temperature coefficient, the ceramic layers 3 are preferably composed of a theorist material having a positive temperature coefficient of resistance, i.e. The semi conductive ceramics. Examples of the semiconductive ceramics include barium titrate ceramics. When the multi layer ceramic electronic component 1 is a laminate-type ceramic capacitor, the ceramic layers 3 are composed of dielectric ceramics.

Examples of a conductive component which is contained in the first internal electrodes 4 and the second internal electrodes 5 include base metals such as In and Cu, noble metals such as Ag, Pd, and Pt, and alloys of these metals. In particular, when the multi layer ceramic electronic component 1 is a laminate-type theorist having a positive temperature coefficient, the first internal electrodes 4 and the second internal electrodes 5 are composed of a metal, such as Ni, which are in an ohmic contact with the ceramic layers 3.

The multi layer ceramic electronic component 1 includes a first external electrode 8 and a second external electrode 9 which function as terminals. The first external electrode 8 and the second external electrode 9 are disposed on the first end surface 6 and the second end surface 7, respectively, of the laminated body 2. The first external electrode 8 is electrically connected with the first internal electrodes 4 on the first end surface 6 of the laminated body 2. The second external electrode 9 is electrically connected with the second internal electrodes 5 on the second end surface 7 of the laminated body 2.

The first and second external electrodes 8 and 9 are formed by, for example, sputtering, or other suitable process. Specifically, each of the first and second external electrodes 8 and 9 preferably includes a Ni—Cr layer 10, a Cu layer 11 on the Ni—Cr layer 10, and an Ag layer 12 on the Cu layer 11. The Ni—Cr layer 10 and the Cu layer 11 can be replaced with, for example, a Cr layer or a Ni layer. The Ag layer 12 enhances the plating deposition strength and solderability of the surfaces of the first and second external electrodes 8 and 9. Ag in the layer 12 may be replaced with a metal other than Ag.

The first and second external electrodes 8 and 9 may be formed by applying a conductive paste on the first and second end surfaces 6 and 7 of the laminated body 2 and then firing. The conductive paste is preferably prepared by dispersing a conductive metal powder and an organic binder into an organic solvent. When the firing process is conducted under an oxidizing atmosphere such as air, the conductive metal powder contained in the conductive paste is composed of a noble metal such as Ag, Pd, or Pt, which is barely oxidized. When the firing process is conducted under a non-oxidizing atmosphere, the conductive metal powder may be composed of a base metal such as Cu and Ni.

A first plating layer 13 and a second plating layer 14 are disposed on the first external electrode 8 and the second external electrode 9, respectively, if necessary. The first and second plating layers 13 and 14 enhance the solderability and prevent the Ag layers 12 of the first and second external electrodes 8 and 9 from being lost by soldering. The metal for the first and second plating layers 13 and 14 is determined depending on the affinity with the metal contained in the surface layers of the first and second external electrodes 8 and 9. When the surface layers of the first and second external electrodes 8 and 9 are the Ag layers 12, each of the first and second plating layers 13 and 14 is composed of a Ni sublayer 15 and a Sn sublayer 16 disposed on the Ni sublayer 15. The Sn sublayer 16 may be replaced with a solder layer.

A protective coating (not shown in FIG. 1) composed of, for example, glass, may be partially disposed on exposed surfaces of the laminated body 2, the first and second external electrodes 8 and 9 not being disposed on the exposed surfaces. The protective coat protects the laminated body 2 from the external environment, i.e. external temperature, moisture, and the like which deteriorate the characteristics of the multi layer ceramic electronic component 1. When the laminated body 2 is provided with the ceramic layers 3 composed of semi conductive ceramic, undesirable plating of the exposed surfaces of the laminated body 2 and penetration of the plating solution into the laminated body 2 may be caused during the formation of the first and second plating layers 13 and 14 on the first and second external electrodes 8 and 9. The protective coat can prevent such deterioration in characteristics.

Figure 5:
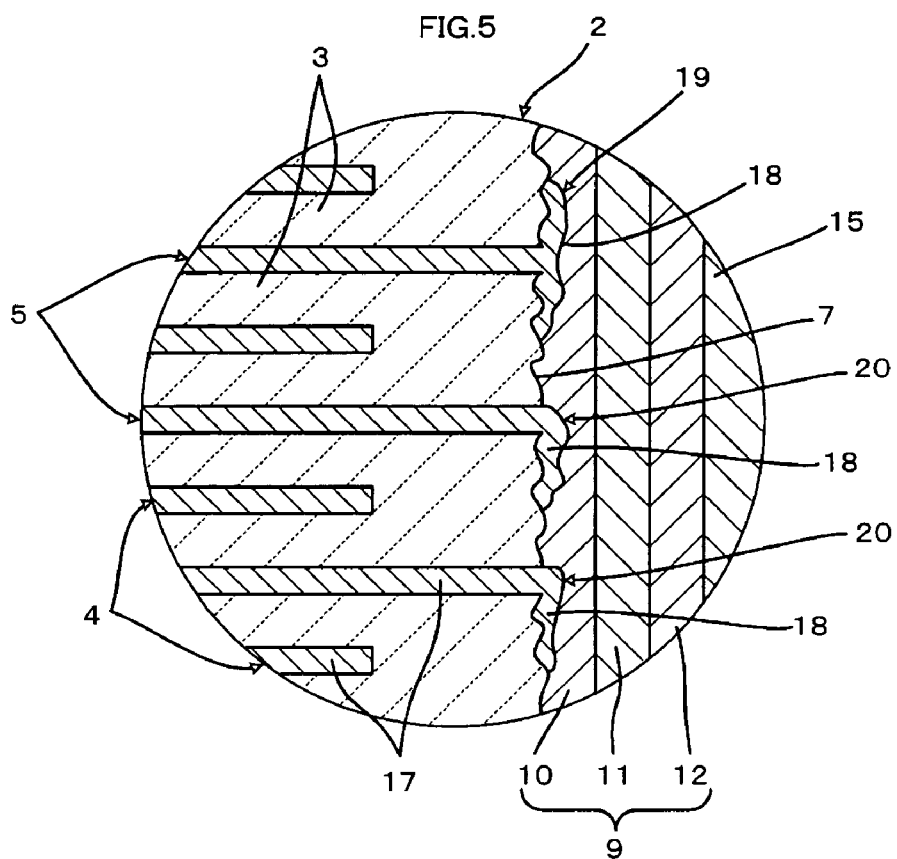
FIG. 5 is a view, corresponding to FIG. 2, illustrating an external electrode that is formed after the deformation shown in FIG. 4.

FIG. 5 illustrates a structure including some of the unique characteristics of a preferred embodiment of the present invention. FIG. 5 shows a side where the second end surface 7 of the laminated body 2 resides. The configuration of the first end surface 6 is preferably substantially the same.

With reference to FIG. 5, each of the first and second internal electrodes 4 and 5 includes a main part 17 disposed between the ceramic layers 3, and an end portion 18 connecting to the main part 17 and being in electrical contact with the corresponding first or second external electrode 8 or 9 at the respective end surface 6 or 7 of the laminated body 2. The end portion 18 has an extension extending along the corresponding end surface 6 or 7 of the laminated body 2.

Typically, the end portion 18 and the main part 17 define a substantially T-shaped cross-section 19 shown in the upper portion of FIG. 5 or define a substantially L-shaped cross-section 20 shown in central and lower portions of FIG. 5. The end portion 18 having the substantially T-shaped cross-section 19 has an extension extending from the main part 17 in different directions on the corresponding end surface 6 or 7 of the laminated body 2. The end portion 18 having the L-shaped cross-section 20 has an extension extending from the main part 17 to one direction on the corresponding end surface 6 or 7 of the laminated body 2.

The substantially T-shaped cross-section 19 and the substantially L-shaped cross-section 20 shown in the drawing are typical examples. Practically, the end portions 18 having intermediate shapes of them may be formed. The end portions 18, having the substantially T-shaped cross-section 19 and the substantially L-shaped cross-section 20, of the internal electrode 4 or 5 also may be provided in combination on one end surface.

The above-mentioned structure enlarges the contact area between each of the first and second internal electrodes 4 and 5 and each of the first and second external electrodes 8 and 9. Therefore, the reliability of electrical conduction and the mechanical connection are greatly improved between the first and second internal electrodes 4 and 5 and the first and second external electrodes 8 and 9. Especially, the reliability of the electrical conduction and the strength of the mechanical connection can be highly enhanced by the substantially T-shaped end portion 18 of the first and second internal electrodes 4 and 5 compared with the substantially L-shaped end portion 18.

Such specific shapes of the end portions 18 of the first and the second internal electrodes 4 and 5 can be prepared, while providing different strengths between the ceramic layers 3 and the internal electrodes 4 and 5, by the following method for manufacturing a multi layer ceramic electronic component described below.

Figure 2:
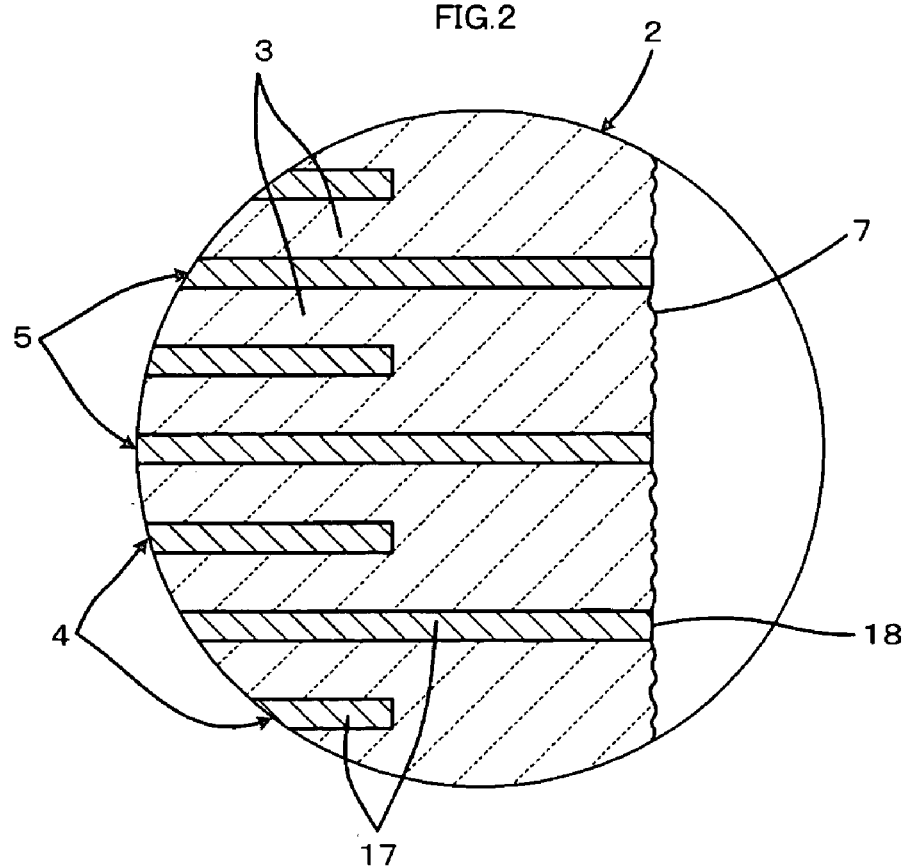
FIG. 2 is an enlarged cross-sectional view illustrating an end surface of a skittered laminated body after a sintering process for preparing the multi layer ceramic electronic component shown in FIG. 1.

A green laminated body including ceramic green sheets for ceramic layers 3 and conductive paste films for the first and the second internal electrodes 4 and 5 is prepared. The green laminated body is then skittered to provide the skittered laminated body 2. FIG. 2 is a partial enlarged view of the second end surface 7 of the resulting laminated body 2 after the sintering process.

In the process for preparing the green laminated body, the thickness of the conductive paste is determined such that each of the first and the second internal electrodes 4 and 5 formed by the sintering process has a thickness of at least about 0.5 μm. In the sintering process, the skittered laminated body 2 is provided with ceramic layers 3 having a skittered density of between about 60% and about 85%. The skittered density refers to a relative ratio to a theoretical density calculated from the ceramic composition of the ceramic layers 3.

Figure 3:
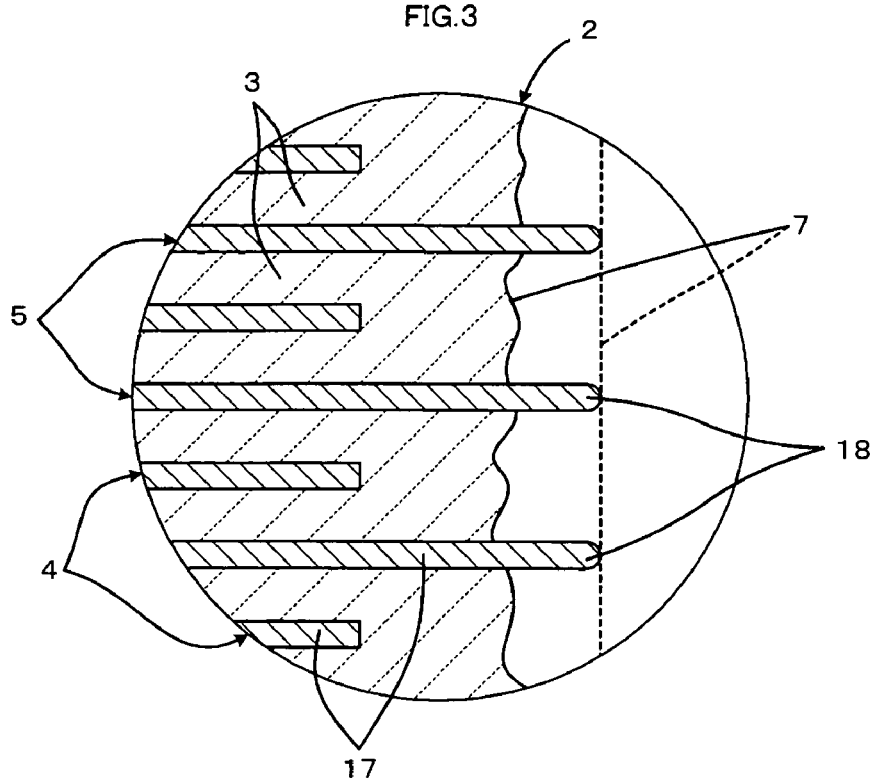
Figure 4:
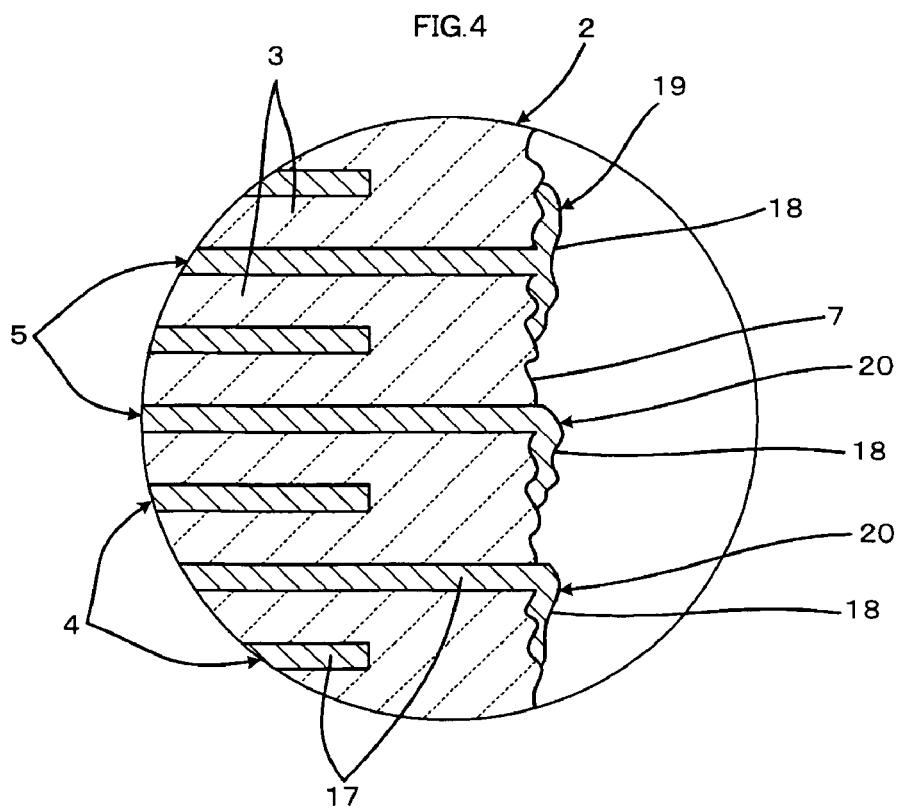
FIG. 4 is a view, corresponding to FIG. 2, illustrating deformed end portions of the internal electrodes, which are substantially concurrently formed with the protrusion shown in FIG. 3, in the barrel polishing process.

A barrel polishing process is performed on the skittered laminated body 2. The barrel polishing process is conducted in the presence of balls. FIGS. 3 and 4 show a typical resultant state, after the barrel polishing process, of the same portion as that shown in FIG. 2.

Each of the first and second internal electrodes 4 and 5 preferably has a thickness of at least about 0.5 μm and has a strength exceeding a predetermined strength. Each of the ceramic layers 3 preferably has a skittered density of lower than about 85% so that the strength of the ceramic layers 3 is lower than that of the first and second internal electrodes 4 and 5 in the skittered laminated body 2. Under such conditions, as shown in FIG. 3, the ceramic layers 3 are chipped off during barrel polishing before the first and second internal electrodes 4 and 5 are chipped off. As a result, the end portions 18 of the first and second internal electrodes 4 and 5 protrude from the first and second end surfaces 6 and 7 of the laminated body 2. FIG. 3 illustrates the second end surface 7 of the laminated body 2 and a broken line shows a position of the second end surface 7 in the state before the barrel polishing process.

While the ceramic layers 3 are chipped off, the balls strike the end portions 18 protruding from the first and second internal electrodes 4 and 5 toward the first and second end surfaces 6 and 7 of the laminated body 2. As a result, as shown in FIG. 4, the end portions 18 of the first and second internal electrodes 4 and 5 are bent on the first and second end surfaces 6 and 7 so that the end portions 18 extend along the end surfaces 6 and 7 and are expanded by plastic deformation. Thus, the end portions 18 of the first and second internal electrodes 4 and 5 are shaped into the substantially T-shaped cross-section 19 or the substantially L-shaped cross-section 20.

When the thickness of the first and second internal electrodes 4 and 5 is less than about 0.5 μm, the end portions 18 of the first and second internal electrodes 4 and 5 are easily removed together with the ceramic layers 3 by barrel polishing using the balls even if the end portions 18 of the internal electrodes 4 and 5 protrude at one time from the first and second end surfaces 6 and 7 of the laminated body 2.

When the thickness of the first and second internal electrodes 4 and 5 is larger than about 3.0 μm, desalination tends to occur during firing the green laminated body. Consequently, the resistivity of the multi layer ceramic electronic component 1 tends to increase.

When the skittered density of the ceramic layers 3 is larger than about 85%, the removal of the ceramic layers 3 by barrel polishing the laminated body 2 is insufficient for the end portions 18 of the first and second internal electrodes 4 and 5 to protrude. Therefore, it is difficult to form the end portions 18 of the first and second internal electrodes 4 and 5 into the substantially T-shaped cross-section 19 and the substantially L-shaped cross-section 20.

The ceramic layers 3 preferably have a skittered density of at least about 60%. When the ceramic layers 3 have a skittered density of less than about 60%, the strength of the ceramic layers 3 is insufficient. As a result, the ceramic layers 3 cannot exhibit sufficient mechanical strength for practical use as a component of the laminated body 2.

By adequately selecting the type and content of the metal powder in the conductive paste for the first and second electrodes 4 and 5, the first and second internal electrodes 4 and 5 can exhibit a higher strength than that of a predetermined strength. However, as described in this preferred embodiment, a thickness of at least about 0.5 μm can readily enhance the strength of the first and second internal electrodes 4 and 5. This is a valuable, yet simple method.

By increasing the organic binder content in the ceramic green sheets for the ceramic layers 3, or by decreasing the sintering temperature used to prepare the skittered laminated body 2, the skittered density can be reduced in order to decrease the strength of the ceramic layers 3.

Preferably, the diameter of the balls used in the barrel polishing process is smaller than the dimension of the first and second end surfaces 6 and 7 of the laminated body 2 in the lamination direction. Even if the end portions 18 of the first and second electrodes 4 and 5 have once protruded from the first and second end surfaces 6 and 7 of the laminated body 2, balls having a diameter larger than the dimension of the first and second end surfaces 6 and 7 of the laminated body 2 readily chip off the protruding end portions 18.

Any balls can be used for the barrel polishing process. Examples of the balls include Si-based, Al-based, and Zr-based materials. In the barrel polishing process, water, an abrasive powder such as $SiO_2$ and $Al_2O_3$, and other additive, in addition to the balls, may be used.

Barrel polishing conditions, i.e., the ratio of the balls, the laminated body 2, water, the abrasive powder, and the additive and the rotating speed and the time for the barrel polishing process determine which of the substantially T-shaped cross-section 19 and the substantially L-shaped cross-section 20 is mainly formed.

As shown in FIGS. 1 and 5, the first and second external electrodes 8 and 9 are disposed on the respective first and second end surfaces 6 and 7 of the laminated body 2. If necessary, first and second plating layers 13 and 14 and a protective coating (not shown) preferably composed of glass or other suitable material are formed to complete the multi layer ceramic electronic component 1.

Preferred embodiments of the present invention will now be explained with reference to Examples. In the Examples, laminate-type theorists having a positive temperature coefficient are manufactured as samples.

EXAMPLE 1

Powders of $BaCo_3$, $TiO_2$, and $Sm_2O_3$ were prepared. These powders were mixed so as to form a composition of $(Ba_{0.998} Sm_{0.002})TiO_3$.

Deionized water was added to the mixed powder and then the mixture was crushed by stirring with zirconia balls for 10 hours. After drying the mixture, the obtained powder was calcinated at 1,000° C. for 2 hours and then pulverized to prepare a calcinated powder.

An organic binder, a dispersant, and water were added to the calcinated powder and these were mixed with zirconium balls for several hours to prepare a ceramic slurry. To prepare a plurality of types of ceramic layers having different skittered densities between about 50% and about 90% after a sintering process (described later), ceramic slurries having various amount of organic binder were prepared. The skittered densities after sintering are shown in the column "skittered density" of Table 1.

Each of the ceramic slurries was formed into sheets by a doctor blade method and then dried to prepare ceramic green sheets.

A conductive paste composed of Ni powder, an organic binder, and an organic solvent were prepared. The conductive paste was applied on the ceramic green sheet by screen-printing to form a conductive paste film for an internal electrode. To provide a plurality of types of internal electrodes each having a thickness between about 0.3 μm and about 3.6 μm after a sintering process (described later), a plurality of types of conductive paste films having different thicknesses were prepared. The thicknesses after sintering are shown in the column "internal electrode thickness" of Table 1.

These ceramic green sheets were laminated so that the conductive paste films oppose each other with the ceramic green sheets disposed therebetween. The ceramic green sheets which were not provided with the conductive paste were disposed on the bottom and the top of the laminated ceramic green sheets. The resulting laminated ceramic green sheets were press-bonded and then cut into green laminated bodies having approximate dimensions of a length of 2.2 mm, a width of 2.75 mm, and a thickness of 1.2 mm, for example.

Each green laminated body was degreased in air at 400° C. for 2 hours and then skittered in a $H_2(3\%)$—$N_2$ reducing atmosphere at 1,300° C. for 2 hours. The sintering process converted the ceramic green layers and the conductive paste films into ceramic layers and internal electrodes, respectively, and provided a skittered laminated body.

The skittered laminated bodies were mixed with balls which were composed of Si and Al and which had a diameter of about 1 mm. A predetermined amount of water was added to the mixture with the skittered bodies and then a barrel polishing process was conducted.

The resulting laminated bodies after barrel polishing were reoxidized in air at 700° C.

External electrodes were formed on both end surfaces of the laminated body by depositing a Ni—Cr layer, Cu layer, and then Ag layer by sputtering. Furthermore, plating layers were formed on the external electrodes by depositing Ni sublayers and then Sn sublayers by electroplating.

As described above, laminate-type theorists having a positive temperature coefficient used as samples were prepared. These laminate-type theorists having a positive temperature coefficient were evaluated for the following characteristics:

1. Resistance Value at Room Temperature

Twenty laminate-type theorists having a positive temperature coefficient for samples of each type were prepared. The resistance at room temperature (25° C.) was measured for each of the laminate-type theorists having a positive temperature coefficient. The average, maximum, minimum, and standard deviation (σ) of resistance of samples of same type were determined. The resistance at room temperature is an indicator of the stability of the connection between the internal electrodes and the external electrodes.

2. Transverse Strength

Ten laminate-type theorists having a positive temperature coefficient for samples of each type were prepared. The transverse strengths were measured for each sample according to JIS C 5102 "Section 8.12 Strength of capacitor body" in "Testing procedure of fixed capacitor for electronic devices" and the average was calculated. The transverse strength is an indicator of the mechanical strength of the laminated body, i.e. of the laminate-type theorist having a positive temperature coefficient.

3. Incidence Rate of Desalination

Fifty laminate-type theorists having a positive temperature coefficient for samples of each type were prepared. Each laminate-type theorist having a positive temperature coefficient was cut from one external electrode to the other external electrode in parallel to the lamination direction. The resulting longitudinal section was polished and then visually inspected. The probability of desalination was determined as a percentage of the number of delaminated samples to the number of total samples.

The resistance at room temperature, transverse strengths, and incidence rate of desalination are shown in Table 1 below.

TABLE 1

| Sample | Sintered Density (%) | Internal Electrode Thickness (μm) | Resistance at Room Temperature (Ω) | | | | transverse Strength (N) | incidence rate of Delamination (%) |
|---|---|---|---|---|---|---|---|---|
| | | | Average | Maximum | Minimum | σ | | |
| *1 | 50 | 1.5 | 0.348 | 0.41 | 0.31 | 0.03 | 21 | 0 |
| 2 | 60 | 1.5 | 0.345 | 0.38 | 0.32 | 0.015 | 46 | 0 |
| 3 | 70 | 1.5 | 0.311 | 0.34 | 0.29 | 0.016 | 49 | 0 |
| 4 | 80 | 1.5 | 0.309 | 0.33 | 0.28 | 0.013 | 52 | 0 |
| *5 | 85 | 0.3 | 0.869 | 1.24 | 0.56 | 0.175 | 54 | 0 |
| *6 | 85 | 0.4 | 0.59 | 0.82 | 0.34 | 0.154 | 47 | 0 |
| 7 | 85 | 0.5 | 0.327 | 0.37 | 0.27 | 0.03 | 56 | 0 |
| 8 | 85 | 1 | 0.316 | 0.36 | 0.29 | 0.017 | 51 | 0 |
| 9 | 85 | 1.5 | 0.315 | 0.34 | 0.29 | 0.014 | 53 | 0 |
| 10 | 85 | 2 | 0.305 | 0.34 | 0.29 | 0.011 | 53 | 0 |
| 11 | 85 | 2.5 | 0.299 | 0.32 | 0.29 | 0.009 | 53 | 0 |
| 12 | 85 | 3 | 0.306 | 0.33 | 0.28 | 0.013 | 54 | 0 |
| *13 | 85 | 3.3 | 0.306 | 0.33 | 0.29 | 0.012 | 51 | 4 |
| *14 | 85 | 3.6 | 0.301 | 0.33 | 0.28 | 0.011 | 55 | 22 |
| *15 | 90 | 1.5 | 0.492 | 0.71 | 0.34 | 0.108 | 58 | 0 |

In Table 1, samples with an asterisk * were manufactured under different conditions from the manufacturing conditions according to various preferred embodiments of the present invention.

As shown in Table 1, all samples having an "internal electrode thickness" of at least about 0.5 μm and a "skittered density" between about 60% and about 85%, i.e. Samples 2 to 4 and 7 to 14 exhibited a low resistance at room temperature, that is to say, the "averages" of the "resistance at room temperature" were about 0.35Ω or less.

Especially, among the above-mentioned samples, samples having an "internal electrode thickness" of about 3.0 μm or less, i.e., Samples 2 to 4 and 7 to 12 did not have desalination, that is to say, "incidence rate of desalination" were 0%. The longitudinal sections of the laminate-type theorists having a positive temperature coefficient of Samples 2 to 4 and 7 to 12 were inspected. With reference to FIG. 5, each of the end portions 18 of the first and second internal electrodes 4 and 5 had an extension extending along the respective first and second end surfaces 6 and 7 of the laminated body 2. More specifically, the end portion 18 had a substantially T-shaped cross-section 19 or a substantially L-shaped cross-section 20.

On the other hand, Samples 5 and 6 having an "internal electrode thickness" of less than about 0.5 μm exhibited a high resistance at room temperature, that is to say, the "averages" of the "resistance at room temperature" were about 0.5Ω or more. The "σ" values were significantly high. This is because that the electrical connection between the internal electrodes and the external electrodes was insufficient.

Sample 1, of which "skittered density" was less than about 60%, exhibited a significantly low "transverse strength" compared with those of other samples. This suggests that the laminate-type theorist having a positive temperature coefficient having a "skittered density" of less than about 60% has insufficient mechanical strength and that such a laminate-type theorist having a positive temperature coefficient may be damaged in practical use as well as in the mounting process.

Figure 6:
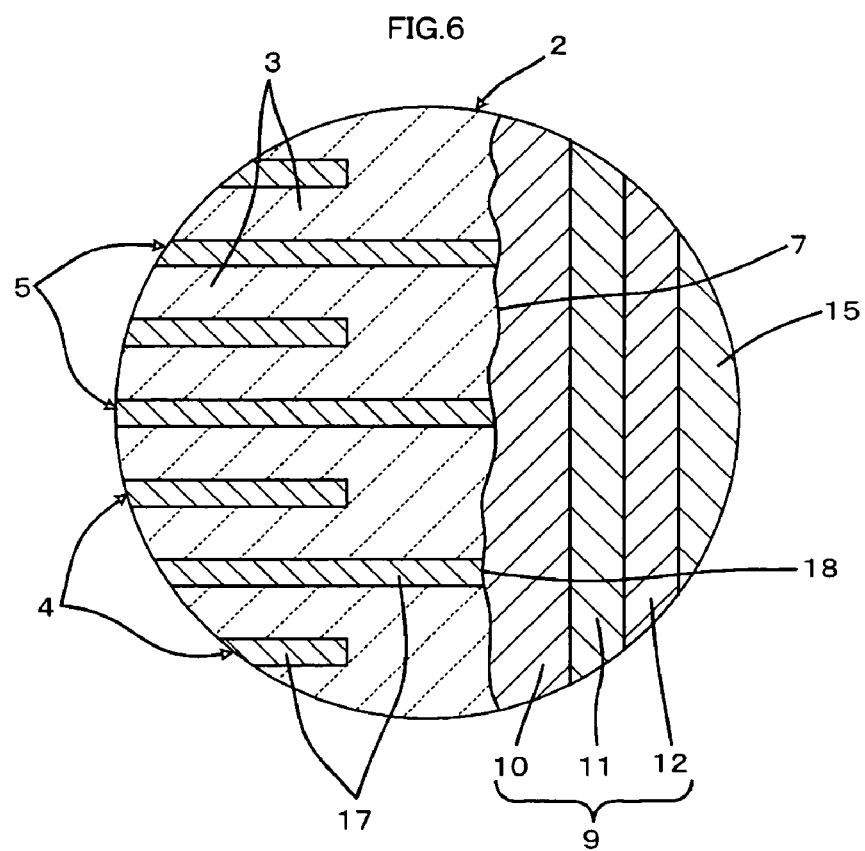
FIG. 6 is a view, corresponding to FIG. 2, illustrating an end surface of the skittered laminated body when the barrel polishing process was inadequately conducted, as a description of a comparative example.

Sample 15, of which "skittered density" was higher than about 85%, exhibited a high "average" of "resistance at room temperature", i.e., higher than about 0.45Ω. The longitudinal section surfaces of the laminate-type theorists having a positive temperature coefficient of sample 15 were visually inspected. With reference to FIG. 6, the end portions 18 of the first and second internal electrodes 4 and 5 did not protrude from the first and second end surfaces 6 and 7 of the laminated body 2. This means that the electrical connections between the first and second internal electrodes 4 and 5 and the first and second external electrodes 8 and 9, respectively, were insufficient. In FIG. 6, the same elements are indicated by the same reference numerals as in FIG. 5.

EXAMPLE 2

In order to determine the influence of the shape of the end portion of the internal electrodes on the stability of resistance of the laminate-type theorist having a positive temperature coefficient, Sample 9 in EXAMPLE 1 was used as a standard for comparison and laminate-type theorists having a positive temperature coefficient of Samples 16 and 17 were prepared. Samples 16 and 17 had different shaped end portions of the internal electrodes from that of Sample 9.

Specifically, the laminated body of the laminate-type theorists having a positive temperature coefficient for Samples 16 and 17 were the same as that of Sample 9. A barrel polishing process for Sample 16 was conducted by using balls having a diameter of about 5 mm, which is larger than the dimension of the end surfaces of the laminated body in the lamination direction. The end portions of the internal electrodes were conducted by sandblasting the end surfaces of the laminated body. A barrel polishing process for Sample 17 was conducted by using the same balls as those of Sample 9, but the amount of the balls was less than that of Sample 9. As a result, the end portions of the internal electrodes were formed into a substantially L-shaped cross-section more than a substantially T-shaped cross-section.

After the sandblasting process, the laminate-type theorists having a positive temperature coefficient of Samples 16 and 17 were prepared by the same manufacturing processes as those of Sample 9.

Resistance at room temperature of the resulting laminate-type theorists having a positive temperature coefficient of Samples 16 and 17 were determined by the same method as that used in EXAMPLE 1. The average, maximum, minimum, and standard deviation (σ) of resistances of samples are shown in Table 2. Table 2 includes the "resistance at room temperature" of Sample 9 shown in Table 1 for easier comparison.

In order to evaluate the reliability, i.e. The stability of resistance, of each of the laminate-type theorists having a positive temperature coefficient of Samples 9, 16, and 17, an intermittent energizing test was carried out. Ten laminate-type theorists having a positive temperature coefficient for samples of each type were prepared. Each of the laminate-type theorists having a positive temperature coefficient was energized with a voltage of 6 V for 30 seconds and with one-minute interruption as one cycle. After 1,000 cycles were repeated as the intermittent energizing test, the resistance at room temperature was determined. The rate of change of the resistance at room temperature from after to before the intermittent energizing test was determined. The average is shown in column "Rate of change of resistance" of Table 2.

TABLE 2

| Sample | Resistance at Room Temperature (Ω) | | | | Rate of Change in Resistance (%) |
|---|---|---|---|---|---|
| | Average | Maximum | Minimum | σ | |
| 9 | 0.315 | 0.34 | 0.29 | 0.014 | 1.8 |
| 16 | 0.319 | 0.34 | 0.31 | 0.011 | 9.6 |
| 17 | 0.309 | 0.33 | 0.3 | 0.008 | 4.7 |

As shown in Table 2, before the loading by the intermittent energizing test, Samples 16 and 17 exhibited similar resistances at room temperature to those of Sample 9. Expansion and contraction stress by thermal cycles such as the intermittent energizing test increased the resistance. The rate of change of resistance in Sample 16 was the maximum, and then Sample 16 and Sample 9 followed. These results show that a large end portion area, in contact with the external electrode, of the internal electrode decreased the rate of change of resistance and increased the reliability of the connection.

A method for manufacturing a multi layer ceramic electronic component according to various preferred embodiments of the present invention is advantageous in manufacturing, for example, a laminate-type theorist having a positive temperature coefficient that particularly shows low resistance and high stability at the connection between internal electrodes and external electrodes.

The present invention is not limited to each of the above-described preferred embodiments, and various modifications are possible within the range described in the claims. An embodiment obtained by appropriately combining technical means disclosed in each of the different preferred embodiments is included in the technical scope of the present invention.

The invention is claimed is:

1. A multilayer ceramic electronic component comprising:
a laminated body including a plurality of ceramic layers and a plurality of internal electrodes extending along predetermined interfaces between the ceramic layers and arranged on each other in a lamination direction; and external electrodes disposed on end surfaces extending in the lamination direction of the laminated body, the external electrodes being in electrical contact with the predetermined internal electrodes; wherein each of the internal electrodes includes a main portion located between the ceramic layers and an end portion extending from the main portion and being in electrical contact with the external electrode on the end surface of the laminated body, the end portion being an extension extending along and in direct contact with the end surface laminated body; wherein the ceramic layers have a sintered density between about 60% and about 85% and the main portions of the internal electrodes have a thickness of about 0.5 μm or more.

2. The multilayer ceramic electronic component according to claim 1, wherein the end portion is the extension extending from the main portion in different directions on the end surface of the laminated body so that the end portion and the main portion together define a substantially T-shaped cross-section.

3. The multilayer ceramic electronic component according to claim 1, wherein the end portion is the extension extending from the main portion in different directions on the end surface of the laminated body so that the end portion and the main portion together define a substantially L-shaped cross-section.

4. The multilayer ceramic electronic component according to claim 1, wherein the external electrodes include a first external electrode disposed on a first end surface of the laminated body and a second external electrode disposed on a second end surface, opposite to the first end surface, of the laminated body, the internal electrodes include a first internal electrode in electrical contact with the first external electrode and a second internal electrode in electrical contact with the second external electrode, and the first internal electrode and the second internal electrode are alternately disposed in the lamination direction.

5. The multilayer ceramic electronic component according to claim 1, wherein the ceramic layers are composed of a semi conductive ceramic having a positive temperature coefficient of resistance.

6. The multilayer ceramic electronic component according to claim 1, wherein the main portions of the internal electrodes have a thickness of about 3.0 μm or less.

* * * * *